United States Patent
Yamaji et al.

[11] Patent Number: 6,136,094
[45] Date of Patent: Oct. 24, 2000

[54] CRUCIBLE FOR CRYSTAL PULLING AND METHOD OF MANUFACTURING SAME

[75] Inventors: Masatoshi Yamaji; Katsuhide Nagaoka; Toshiharu Hiraoka; Tsuyoshi Matsumoto; Satoshi Ishikawa, all of Kagawa, Japan

[73] Assignee: Toyo Tanso Co., Ltd., Osaka, Japan

[21] Appl. No.: 09/147,446

[22] PCT Filed: Jun. 26, 1997

[86] PCT No.: PCT/JP97/02211

§ 371 Date: Feb. 2, 1999

§ 102(e) Date: Feb. 2, 1999

[87] PCT Pub. No.: WO97/49844

PCT Pub. Date: Dec. 31, 1997

[30] Foreign Application Priority Data

Jun. 27, 1996 [JP] Japan ................................. 8-188160
Sep. 30, 1996 [JP] Japan ................................. 8-280138

[51] Int. Cl.$^7$ .................................................. C30B 35/00
[52] U.S. Cl. .............................................. 117/200; 117/900
[58] Field of Search ........................... 117/20, 200, 900; 428/34.1; 432/264

[56] References Cited

U.S. PATENT DOCUMENTS 5,858,486  1/1999  Metter et al. ........................... 428/34.1
5,954,875  9/1999  Kato et al. .............................. 117/217

FOREIGN PATENT DOCUMENTS 3-43250   9/1991   Japan .
4-238865  8/1992   Japan .
8-26881   1/1996   Japan .
10-330185 12/1998  Japan .

*Primary Examiner*—Felisa Hiteshaw
*Attorney, Agent, or Firm*—Oblon, Spivak, McClelland, Maier & Neustadt, P.C.

[57] ABSTRACT

The present invention is directed to a single crystal pulling crucible of carbon fiber reinforced carbon composite material formed by the filament windings by combination of axially reinforced layers as well as circumberentially reinforced layers, which combination is given in two or more sets, and to the producing method thereof. The circumferentially reinforced layers resist a force tending to exapand a drum portion of the crucible, and the axially reinforced layers resist a force tending to push down a bottom of the crucible. The axially reinforced layers extending from the bottom portion to the drum portion can be formed by at least either of a level winding of a contact angle of 0° to 10° with respect to the center axis and a poral winding, and the circumferentially reinforced layers in area adjacent to the drum portion out of the drum portion and the bottom portion can be formed by at least either of a parallel winding of a contact angle of 70° to 90° with respect to the center axis and a helical winding. When the axially reinforced layers cover the center of the bottom portion, an integral crucible of C/C composite material with no hole is provided. When the surface of the C/C composite material is impregnated and covered with a pyrolytic carbon, improved resistance to forming SiC is provided.

20 Claims, 9 Drawing Sheets

CRUCIBLE FOR CRYSTAL PULLING AND METHOD OF MANUFACTURING SAME

This Application is a 371 of PCT/JP97/02211 Jun. 26, 1997.

TECHNICAL FIELD

The present invention relates to a crucible applied to a single crystal pulling apparatus for pulling single crystals of silicon, gallium or their compounds and to a producing method thereof. More particularly, the present invention relates to a crucible made of carbon fiber reinforced carbon composite material and to a method of producing a single crystal pulling crucible of carbon fiber reinforced carbon composite material by filament windings.

BACKGROUND ART

The present invention relates to a single crystal pulling crucible applied to an apparatus for pulling semiconductor single crystals by the Czochralski process (the CZ process) and to a producing method thereof.

For producing single crystals of silicon by the CZ process, a quartz crucible for silicon to be fused in the inside thereof and a carbon crucible for receiving the quartz crucible therein and supporting the same from outside have been used hitherto.

In use, the quartz crucible is subjected to the heat of fused silicon to be softened and thus is put into the state of its outside surface being closely contacting with the inner surface of the carbon crucible. If the quartz crucible is cooled in this state, a large stress will be generated in the carbon crucible having a larger coefficient of thermal expansion than the quartz crucible.

Proposals have been made that a single crystal pulling crucible be made of carbon fiber reinforced carbon composite material or C/C composite material having a mechanical strength to withstand the stress and a coefficient of thermal expansion relatively close to that of the quartz crucible, and to easily correspond with increase of size.

Japanese Utility Model Publication No. Hei 3 (1991)-43250 proposed that the crucible comprising a drum portion and a bottom portion be made of the C/C composite material at the drum portion only or over the entirety thereof. It also proposed that the filament windings be used as the producing method to mold the crucible by carbon fibers impregnated with matrix precursor is being helically wound on a crucible-like mandrel.

However, it is hard to wind the carbon fibers helically on the bottom portion having a curved form like a bowl, without any slip caused. This results in the insufficient winding of the bottom portion, and as such could not allow the bottom portion to have a sufficient strength.

Experiments show that the stress is most concentrated on an area extending from the drum portion to the bottom portion, and in the light of the difficulties in making the entire crucible by using the C/C composite material by the filament windings, the modification was proposed that only a boundary portion between the drum portion and the bottom portion be made of the C/C composite material. However, this modified method also uses the filament windings of carbon fibers impregnated with matrix precursors being wound on a crucible-like mandrel by using a parallel winding or a helical winding, in molding the crucible. Although it is easier to produce only the boundary portion between the drum portion and the bottom portion by using the C/C composite material than to produce the entirety of the drum portion and the bottom portion by using the C/C composite material, since the boundary portion between the drum portion and the bottom portion also has a curved part, it was still hard to effect the parallel winding or the helical winding at such a curved part, without any slip caused. As a result of this, those conventional methods have not succeeded in proposing the single crystal pulling crucibles of the C/C composite material having a sufficient strength not only at the drum portion but also at the bottom portion.

Also, the crucible-like mandrel used in the filament windings has the form of a shaft being extended through both ends of the bottom portion and the drum portion at the center thereof. Because of this, even when the entirety of the drum portion and bottom portion is produced by using the C/C composite material, the hole will inevitably remain at the center of the bottom portion, thus requiring to plug that part with another C/C composite material.

In addition, since the C/C composite material is more porous than graphite, there presented a problem of the C/C composite material tending to react with silicon to form SiC readily.

In order to solve these problems involved in the prior art, the invention has been made. It is the primer object of the invention to provide a single crystal pulling crucible of the C/C composite material wherein not only the cylindrical drum portion but also the bowl-like bottom portion are reinforced by the filament windings.

It is the second object of the invention to provide a single crystal pulling crucible of the C/C composite material which is reinforced as a whole, with a part not fully covered by the filament windings being supplemented by using carbon fiber sheets.

It is the third object of the invention to provide a single crystal pulling crucible of the C/C composite material wherein the bowl-like bottom portion has no hole and the entire bottom portion is reinforced.

It is the forth object of the invention to provide a single crystal pulling crucible of the C/C composite material wherein a surface property of the C/C composite material is so improved as to be resistant to forming SiC.

It is the fifth object of the invention to provide the method for easily and reliably producing a single crystal pulling crucible of the C/C composite material wherein no hole is provided and not only the cylindrical drum portion but also the bowl-like bottom portion are reinforced by the filament windings.

It is the sixth object of the invention to provide the method for effectively producing a single crystal pulling crucible of the C/C composite material wherein a hole is provided and not only the cylindrical drum portion but also the bowl-like bottom portion are reinforced by the filament windings.

DISCLOSURE OF THE INVENTION

The filament windings include combination of axially reinforced layers and circumferentially reinforced layers, which combination is given in two or more sets. The cicumferentially reinforced layers resist a force tending to expand a drum portion of the crucible, and the axially reinforced layers resist a force tending to push down a bottom portion of the crucible. The axially reinforced layers extending from the bottom portion to the drum portion can be formed by at least either of a level winding of a contact angle of 0° to 10° with respect to the center axis and a poral winding, and the circumferentially reinforced layers in an area adjacent to the drum portion out of the bottom portion and the drum portion can be formed by at least either of a parallel winding of a contact angle of 70° to 90° with respect to the center axis and a helical winding. When the axially reinforced layers cover the center of the bottom portion, an integral crucible of C/C composite material having no hole is provided. When the surface of the C/C composite material is impregnated and covered with a pyrolytic carbon, improved resistance to forming SiC is provided. Also, when a carbon fiber cloth is laminated as an innermost layer of the crucible when required, improved contactability of the crucible with the quartz crucible is provided.

The reinforced layers formed by the windings laying over the bottom portion and extending therefrom to the drum portion provides increased density at the center of the bottom portion but decreases in density in the drum portion. The reinforced layers wound on the drum portion circumferentially change the drum portion from sparsity to density, yet a part of the bottom portion adjacent to the drum portion remains sparse.

Then, in place of or in addition to extended circumferential winding to that adjacent part, a plurality of carbon fiber sheets are laminated on that adjacent part in a ring-like form. This can provide circumferential strength for the adjacent part and also can provide uniform thickness of the whole. The carbon fiber sheets are covered with the reinforced layer formed by the winding laying over the bottom portion and extending therefrom to the drum portion.

When a mandrel having a shaft projecting to the opposite side to the protruding portion of the crucible-like mandrel is used, an one-piece molded member of the crucible of the C/C composite material having no hole in the bottom portion can be produced.

When a pair of crucible-like mandrels which are formed in one-piece by their sides opposite to the protruding portions being butted with each other and have a shaft projecting toward the protruding portion is used, two molded members of the crucible of the C/C composite material can be produced simultaneously, including an one-piece molded member of the crucible of the C/C composite material having a hole in the bottom portion.

BEST MODE FOR CARRYING OUT THE INVENTION

Figure 1:
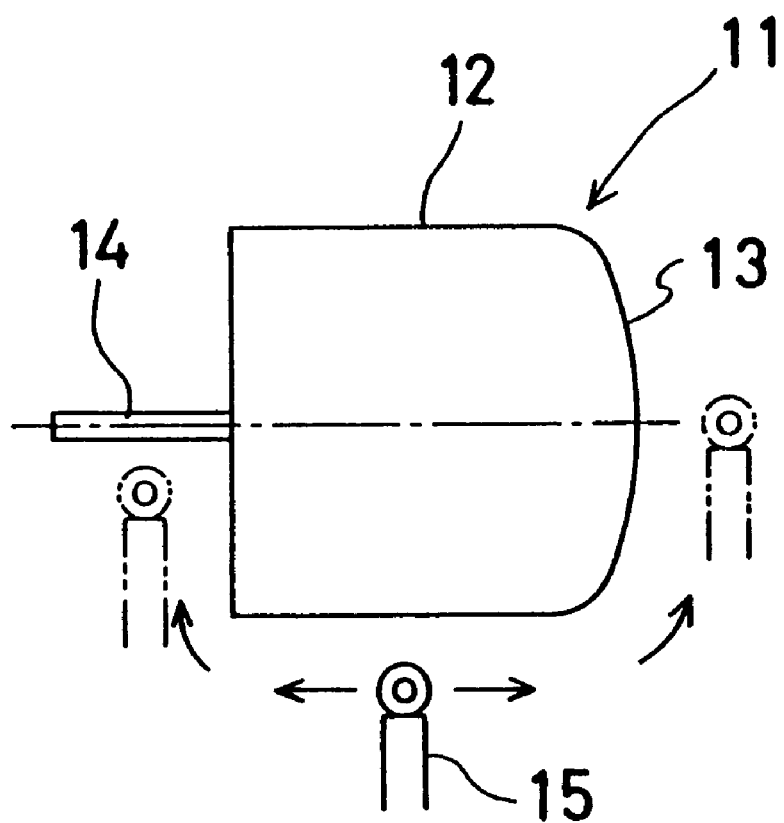
FIG. 1 is a side elevation view of a mandrel for producing a molded member of a crucible.

A mandrel 11 shown in FIG. 1 is made of metal, comprising a cylindrical portion 12, a protruding portion 13 protruding from one end of the cylindrical portion 12, and a shaft 14 projecting from the other end of the cylindrical portion 12 at the center thereof. The cylindrical portion 12 has an outer diameter substantially equal to an inner diameter of a drum portion of a crucible and slightly longer than the drum portion of the crucible. The protruding portion 13 has a curved outer periphery extending along a curved form of the inside of the crucible at the bottom portion thereof. When the mandrel 11 is supported by the shaft 14 capable of a controlled rotation and a delivery eye 15 for feeding a carbon fiber impregnated with a matrix precursor through it is moved along the outer periphery of the mandrel 11, as illustrated, the filament windings including a poral winding, a parallel winding and a level winding can be freely performed. The carbon fibers wound on the side surface of the cylindrical portion 12 at the other end will then be a dead turn. Since the carbon fibers may slip on a circumferential portion of the cylindrical portion at the other end side, a pin may be placed to stop displacement of the carbon fibers.

Figure 2:
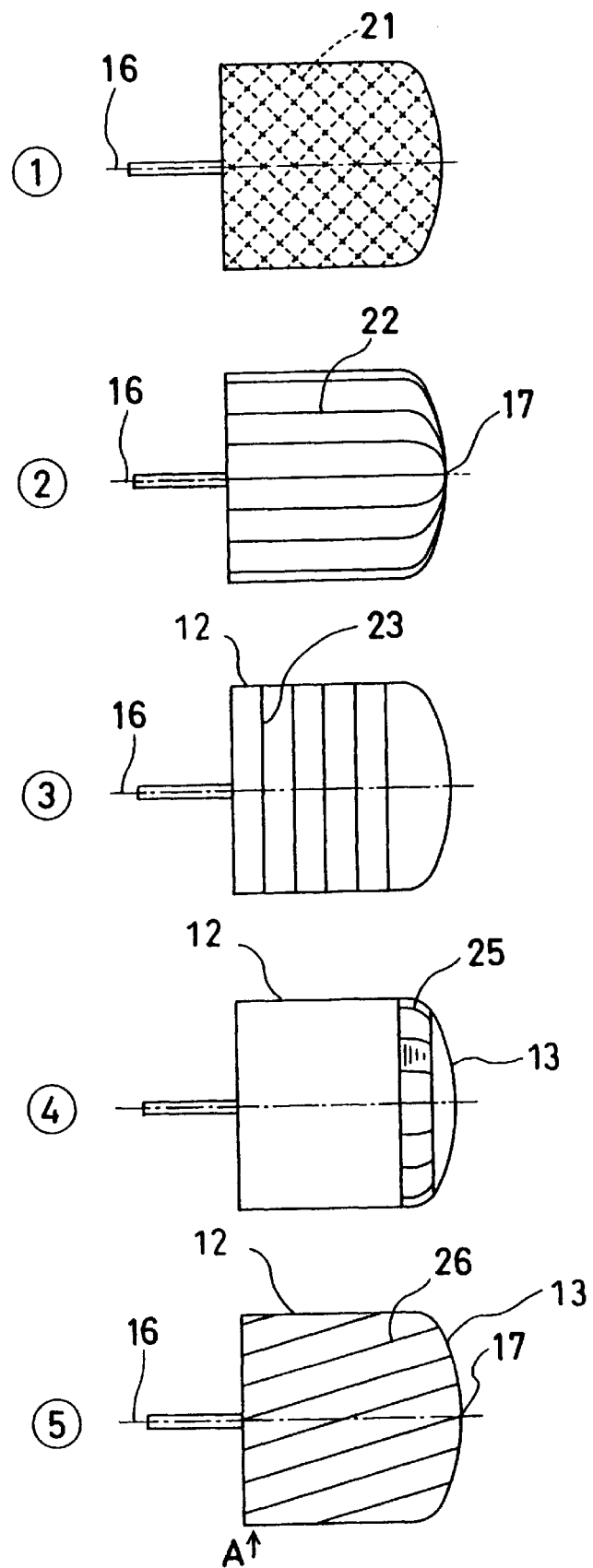
FIG. 2 illustrates the molding processes to produce the molded member of a crucible.

Now, with reference to FIG. 2, the processes to produce the molded member by use of the mandrel of FIG. 1 will be described. A first layer of a 2D cloth 21 impregnated with a matrix precursor such as resin is laminated on the mandrel 11 in such a manner that pattern of the weave can intersect a center axis 16 (Process ①). This 2D cloth 21 is used as an innermost layer to provide an inner flat surface.

Then, carbon fibers impregnated with a matrix precursor such as resin are wound around the mandrel 11 by the filament windings.

First, the poral winding 22 of the winding paths passing through the apex 17 of the protruding portion 13 is performed (Process ②). The poral winding 22 is the winding way of the winding path being formed at a contact angle of 0° with respect to the center axis 16 so as to be densely converged on the apex 17. The innermost layer of the 2D cloth 21 is tightened by this poral winding 22.

Then, the parallel winding 23 is performed of the winding extending along the circumferential direction of the cylindrical portion 12 (Process ③). The parallel winding 23 is the winding way of the winding path being formed at a contact angle of approximately 90° with respect to the center axis 16. A circumferentially reinforced layer around the drum portion of the crucible is formed by the parallel winding.

Then, a plurality of 1D pre-preg sheets or 2D cloth sheets 25 impregnated with a matrix precursor such as resin are laminated on an adjacent part of the protruding portion 13 to the cylindrical portion 12 in a ring-like form (Process ④). The adjacent part corresponds to a curved part of the crucible at the bottom having a small radius of curvature, on which the sheets are laminated for adjustment of thickness. It is preferable that the carbon fibers of the sheets 25 being aligned parallel to each other should be oriented to the circumferential direction of the mandrel.

Then, the level winding 26 is performed of the winding laying over the protruding portion 13 and extending therefrom to the cylindrical portion 12 (Process ⑤). The level winding 26 is the winding way of the winding path being formedat a contact angle of 0° to 10° with respect to the center axis 16. An axially reinforced layer around a part of the crucible extending from the bottom portion to the drum portion is formed by the level winding.

At that time, in order to prevent the level winding 26 in the protruding portion 13 from converging on the apex 17, the winding is performed with varied distances from the apex 17 so that the carbon fibers can pass through and spread over the entire curved portion of the protruding portion 13 having a large radius of curvature.

The combined layer substantially uniform in thickness is formed around the mandrel 11 by combination of the parallel winding (Process ③), the lamination of the sheets (Process ④) and the level winding (Process ⑤) described above. A plurality of combined layers formed in the processes ③–⑤ are laminated until the molded member around the mandrel 11 comes to have a predetermined thickness.

Figure 3:
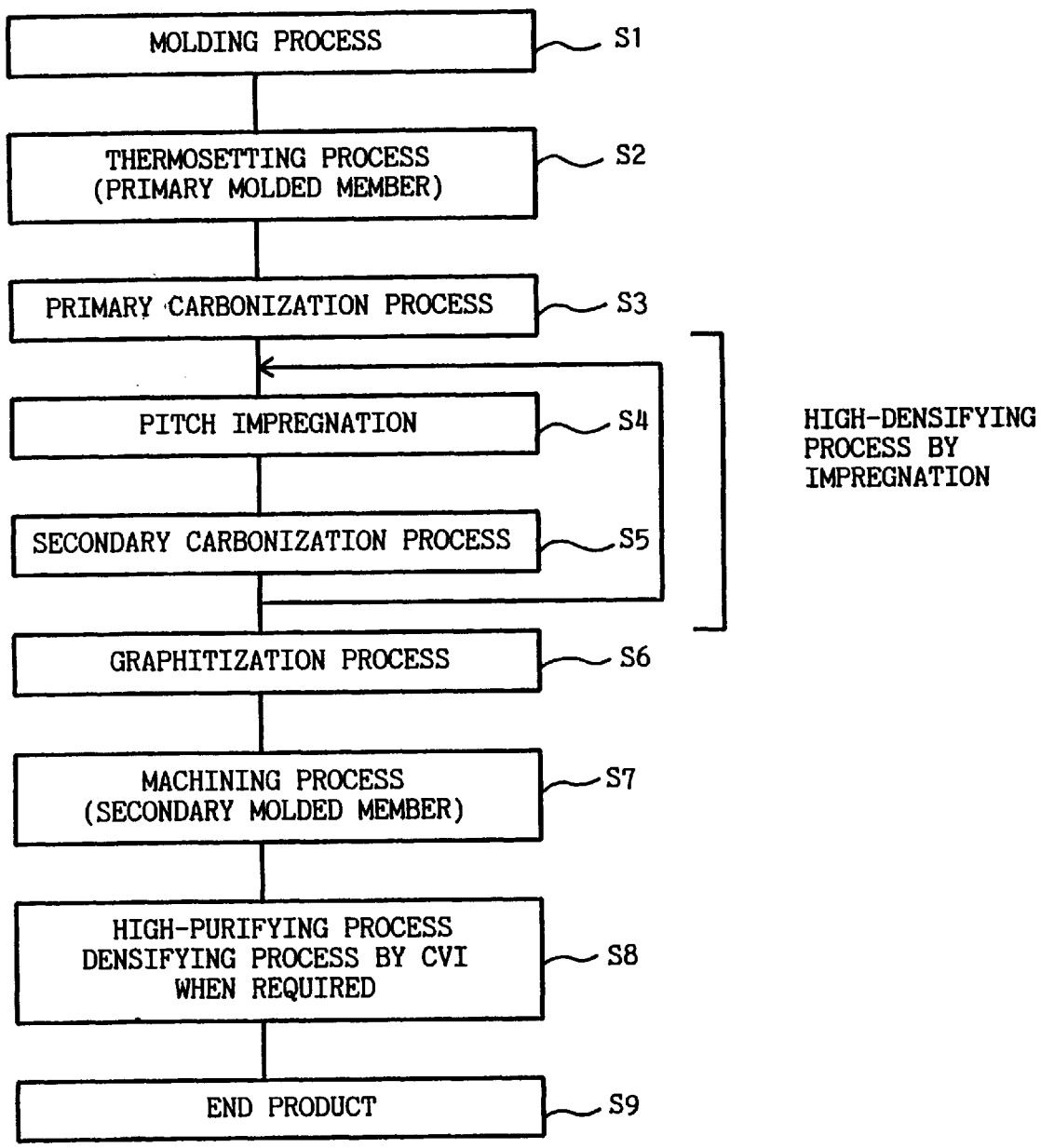
FIG. 3 is a flow chart showing the processes to produce the end product of the crucible made of the C/C composite material.

With reference to FIG. 3, the processes following to the above-described molding process (S1) will now be described. The mandrel around which the molded member is wound is dried as it is.

While an external pressure is applied to the molded member around the mandrel, the molded member is heated to thermoset the resin of the matrix precursor (S2). Then, the molded member is cut along the line A in FIG. 2 to obtain a primary molded member of a crucible form.

The crucible-like primary molded member thus obtained is heated under an inert gas to be subjected to a primary carbonization process (S3). Further, a pitch impregnation process (S4) and a secondary carbonization (S4) are repeated a required number of times to densify the primary molded member by impregnation. When obtaining a required density, the primary molded member is subjected to a graphitization process (S6). Then, the resulting primary molded member is subjected to a required machining process (S7) for the length of the crucible and the outer periphery of the bottom portion of the crucible, to obtain a secondary molded member formed into a specified form.

Further, the secondary molded member thus formed is subjected to a high-purifying process to eliminate impurity therefrom and, when required, fine holes in the surface of the secondary molded member are impregnated with pyrolytic carbon and thus the surface of the secondary molded member is covered with pyrolytic carbon by CVI (Chemical Vapor Impregnation) (S8), to obtain the end product (S9).

Figure 4:
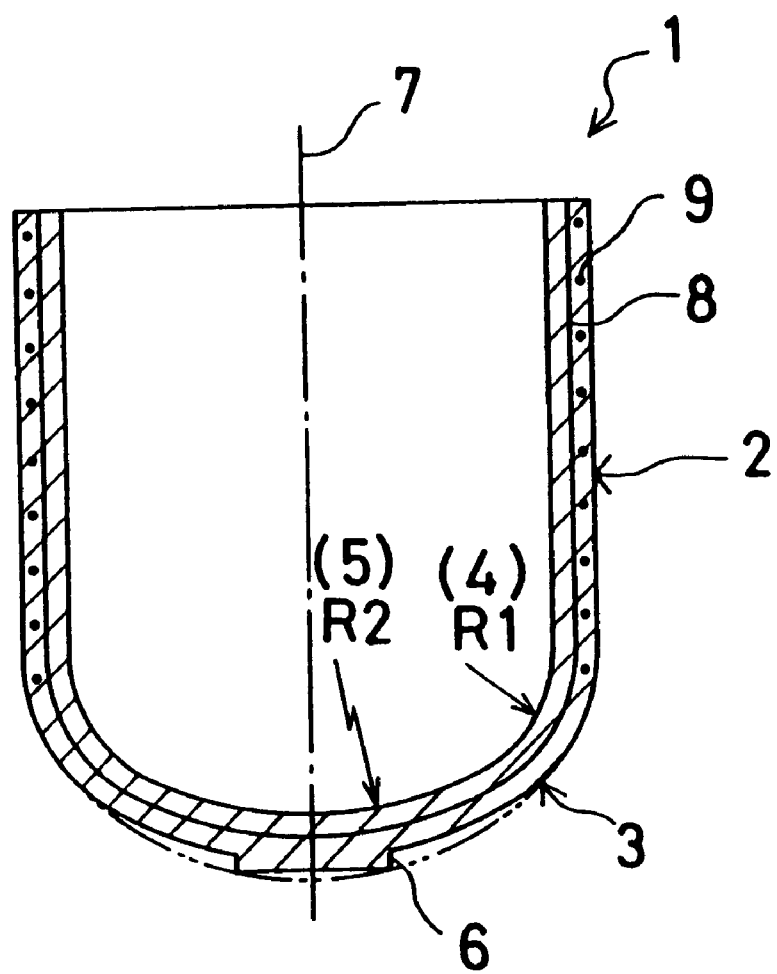
FIG. 4 is a sectional view of the end product of the crucible made of the C/C composite material.

The sectional view of the single crystal pulling crucible thus obtained is shown in FIG. 4. The crucible 1 has an integral structure in which the cylindrical drum portion 2 is integral with the bowl-like bottom portion 3. The bottom portion 3 comprises a first curved portion 4 adjacent to the drum portion 2 and having a small radius of curvature (R1) and a second curved portion 5 having a large radius of curvature (R2) formed around the center axis 7 of the bottom portion 3. The bottom portion 3 has no hole but has a mounting seat 6 formed by machining. This crucible has an axially reinforced layer 8 extending in U-like form from the bottom portion 3 to the drum portion 2 and a circumferentially reinforced layer 9 extending around the drum portion 2.

Figure 5:
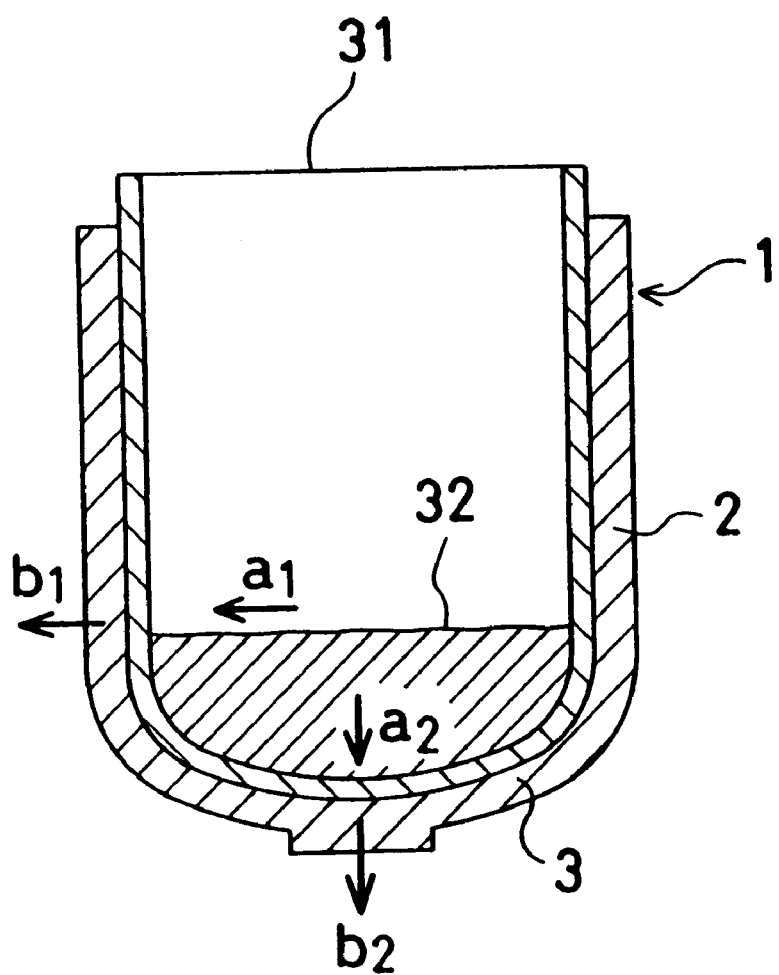
FIG. 5 is a sectional view showing the state of the crucible of the C/C composite material withstanding the stresses.

The single crystal pulling crucible 1 being acted upon by a stress is shown in FIG. 5. When the crucible 1 in which a quartz crucible 31 is fit is cooled, with a small amount of silicon residue 32 remaining in the quartz crucible 31, the crucible 1 is acted upon by a large stress. The silicon residue 32 solidifies at its surface first and then at its part contacting with the bottom portion, and the solidification gradually proceeds to the interior. Since the crucible 1 has a larger coefficient of thermal expansion than the quartz crucible 31 and the silicon expands when solidified, a circumferentially thrusting force a1 is generated and then a downward thrusting force a2 is generated. In other words, in the drum portion 2, an axial stress b2 which tends to peel off the bottom portion 3 from the drum portion 2 is generated, in addition to a circumferential tensile stress b1. The circumferential tensile stress b1 is resisted by the circumferentially reinforced layer 9 of FIG. 4, and the axially stress b2 is resisted by the axially reinforced layer 8 of FIG.

Figure 6:
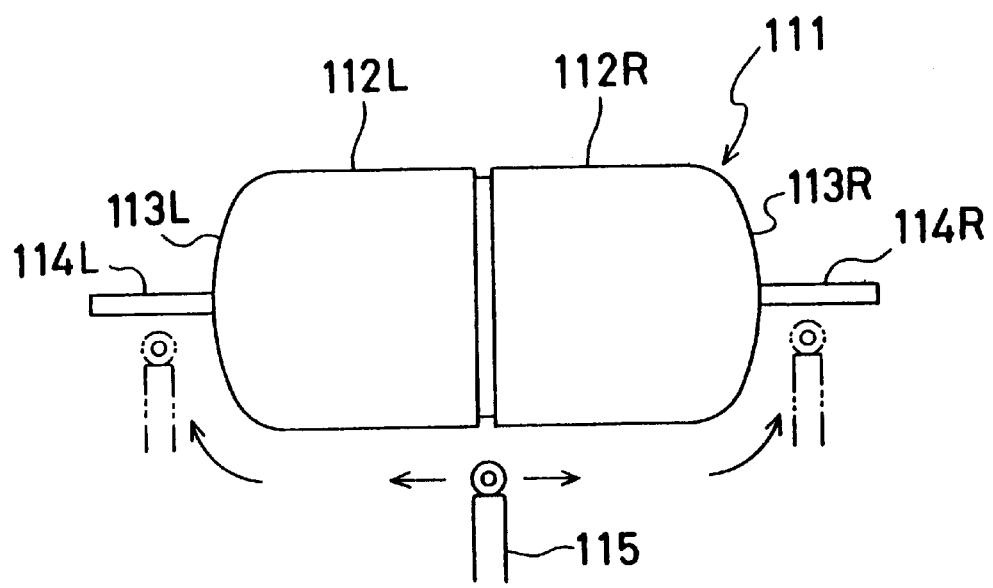
FIG. 6 is a side elevation view of a mandrel for producing a molded members of two crucibles.

FIG. 6 shows a two-shot mandrel 111. The mandrel 111 is made of metal, comprising a right-side cylindrical portion 112R, a right-side protruding portion 113R protruding from one end of the right-side cylindrical portion 112R, a left-side cylindrical portion 112L, a left-side protruding portion 113L protruding from one end of the left-side cylindrical portion 112L, a right-side shaft 114R projecting from the right-side protruding portion 113R at the center thereof, and a left-side shaft 114L projecting from the left-side protruding portion 113L at the center thereof.

The left-side and right-side cylindrical portions 112L, 112R each have an outer diameter substantially equal to an inner diameter of a drum portion of a crucible and slightly longer than twice as long as the drum portion of the crucible. The left-side and right-side protruding portions 113L, 113R each have a curved outer periphery extending along a curved form of the inside of the crucible at the bottom portion thereof. The mandrel 111 is supported by the left-side and right-side shafts 114L, 114R capable of a controlled rotation, and a delivery eye 115 for feeding a carbon fiber impregnated with a matrix precursor through it is moved along the outer periphery of the mandrel 111, as illustrated.

Figure 7:
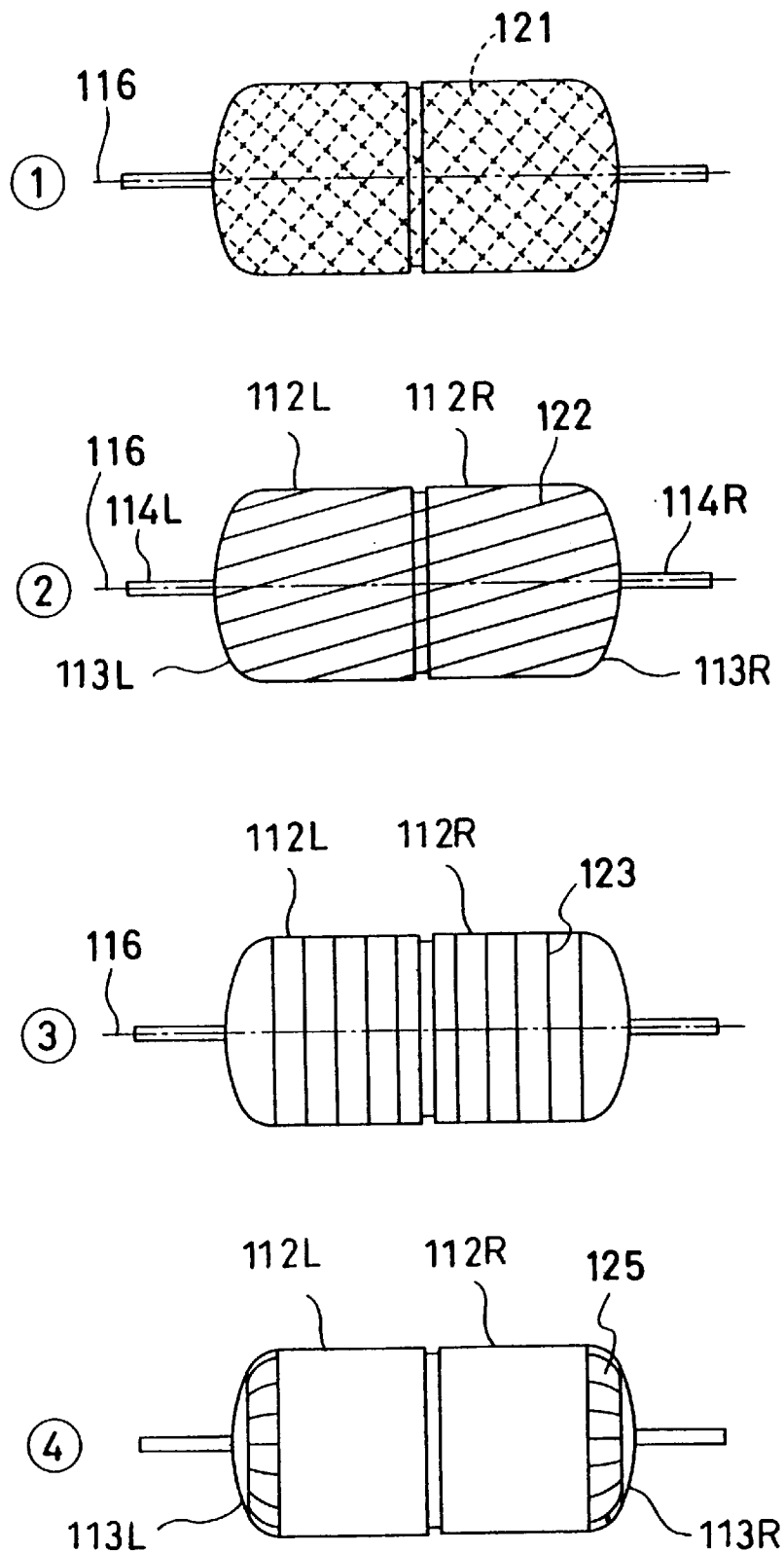
FIG. 7 illustrates the molding processes to produce the molded members of the two crucibles.

FIG. 7 shows the processes to produce the molded member by use of the two-shot mandrel 111. A first layer of a 2D cloth 121 impregnated with a matrix precursor such as resin is laminated on the mandrel 111 in such a manner that pattern of the weave can intersect a center axis 116 (Process ①).

Then, the level winding 122 is performed of the winding laying over the left-side and right-side protruding portions 113L, 113R and extending therefrom to the left-side and right-side cylindrical portions 112L, 112R (Process ②). The level winding 122 is the winding way of the winding path being formed at a contact angle of 0° to 10° with respect to the center axis 116. An axially reinforced layer around a part of the crucible extending from the bottom portion to the drum portion is formed by the level winding. At that time, the winding is performed in such a manner as to allow the level winding 122 in the left-side and right-side protruding portions 113L, 113R to diverge around the left-side and right-side shafts 114L, 114R, so that the carbon fibers can pass through the entirety of the left-side and right-side protruding portions 113L, 113R.

Then, the parallel winding 123 is performed of the winding extending along the circumferential direction of the left-side and right-side cylindrical portions 112L, 112R (Process ③). The parallel winding 123 is the winding way of the winding path being formed at a contact angle of approximately 90° with respect to the center axis 11 6. A circumferentially reinforced layer around the drum portion of the crucible is formed by the parallel winding.

Then, a plurality of 1D pre-preg sheets or 2D cloth sheets 125 impregnated with matrix precursor such as resin are laminated on parts of the left-side and right-side protruding portions 113L, 113R adjacent to the left-side and right-side cylindrical portion 112L,112R in a ring-like form (Process ④).

The adjacent parts correspond to curved parts of the crucible at the bottom portions having a small radius of curvature, on which the sheets are laminated for adjustment of thickness. It is preferable that the carbon fibers of the sheets 125 being aligned parallel to each other should be oriented to the circumferential direction of the mandrel.

The combined layer substantially uniform in thickness is formed around the mandrel 111 by combination of the level winding (Process ②), the parallel winding (Process ③) and the lamination of the sheets (Process ④) described above. A plurality of combined layers formed in the processes ②–④ are laminated until the molded member around the mandrel 111 comes to have a predetermined thickness.

Figure 8:
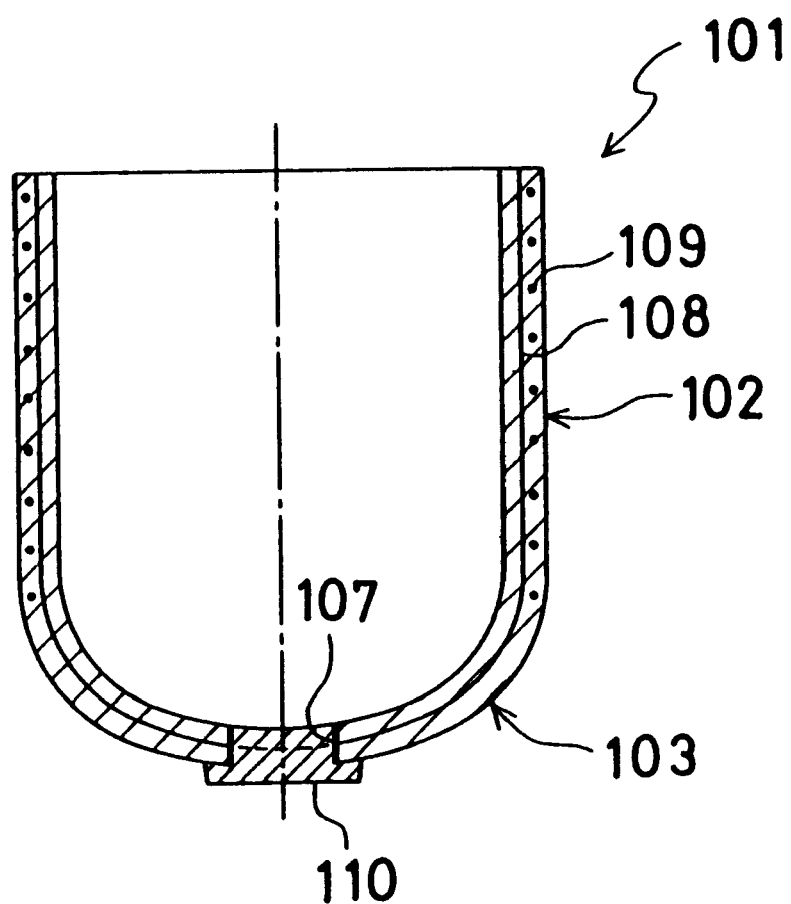
FIG. 8 is a sectional view of the end product of the crucible made of the C/C composite material.

A sectional view of the crucible thus formed is shown in FIG. 8. The crucible 101 has an integral structure in which a cylindrical drum portion 102 is integral with a bowl-like bottom portion 103, as is the case with the FIG. 4 embodiment. At the center of the bottom portion 103, a hole 107 is provided for allowing the left-side and right-side shafts 114L, 114R of the mandrel 111 to pass through it. The hole 107 is plugged by insertion of a plug 110.

Modification may be made such that the plug 110 can be threadingly engaged with the hole 107 by forming a female thread in a hole defining surface of the hole and forming a male thread in a side surface of the plug contacting with the hole defining surface. Alternatively, the hole defining surface of the hole 107 and the cooperative side surface of the plug may be taper or parallel so that the hole and the plug can be engaged with each other. Thus, the axially reinforced layer 108 extends in U-like form, skirting along the hole 107.

A circumferentially reinforced layer 109 is so arranged as to extend along the outer periphery of the drum portion 102, as is the case with the FIG. 4 embodiment. Although the stress acting on the bottom portion 103, particularly on a part around the hole 107 becomes larger, as compared with the crucible having no hole of FIG. 4, the presence of the shaft of the mandrel 111 enables the two-shot mandrel or the effective winding.

Figure 9:
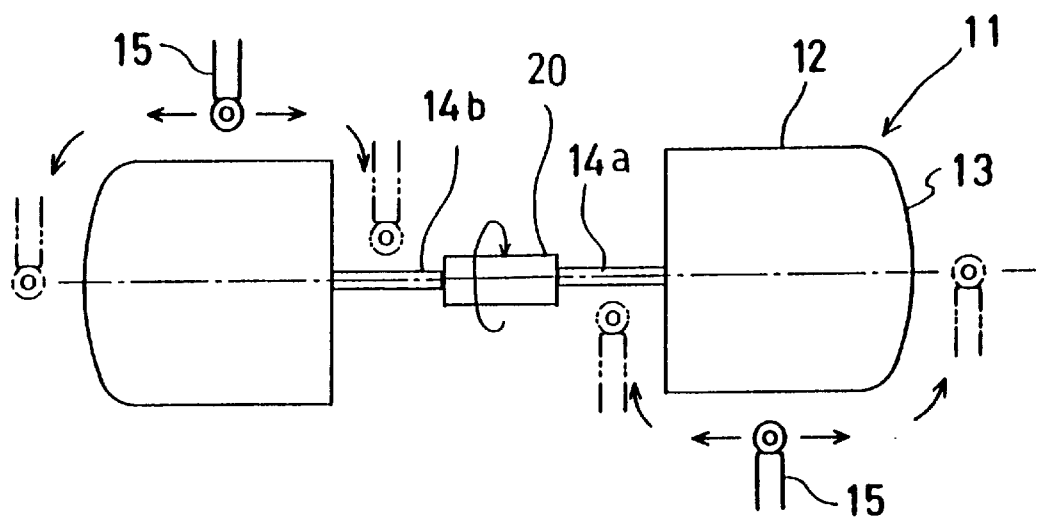
FIG. 9 (*a*) and FIG. 9(*b*) are views showing the positions of the mandrel and others for producing the molded members of the two crucibles.
Figure 9:
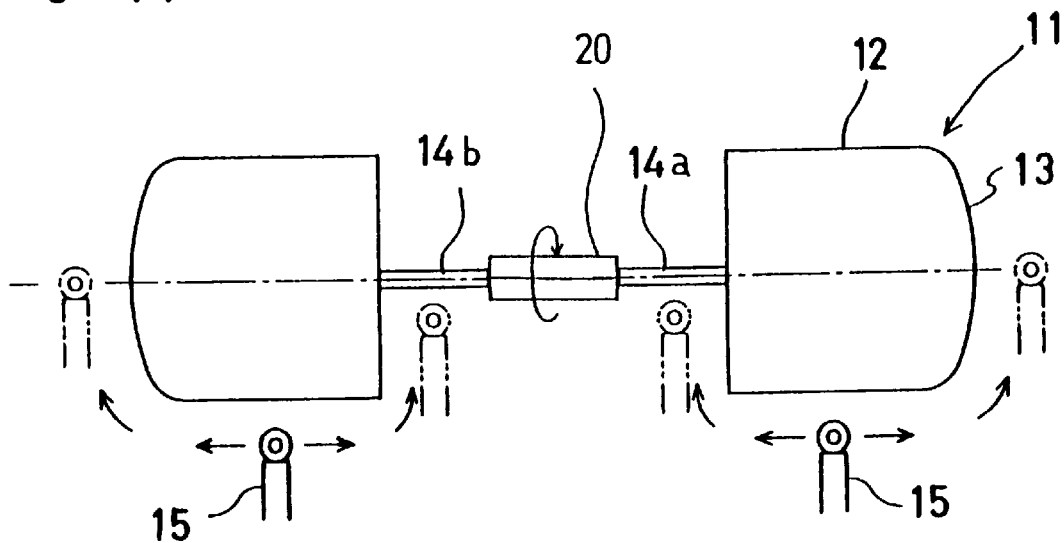

To produce two crucibles each having no hole simultaneously, two mandrels 11 as shown in FIG. 1 may be connected with each other in bilateral symmetric relation through a drive unit 20, as shown in FIG. 9(a) and FIG. 9(b).

In FIG. 9(a) and FIG. 9(b), the drive unit 20 has rotation axes 14a, 14b projecting laterally in the opposite directions. The two mandrels 11 are supported by the rotation axes 14a, 14b.

In FIG. 9(a), two delivery eyes 15 each for feeding a carbon fiber impregnated with matrix precursor through them are disposed in point symmetric relation via the drive unit 20. When each of the delivery eyes 15 is moved along the outer periphery of each mandrel 11, the filament windings including the poral winding, the parallel winding and the level winding can be freely performed.

In FIG. 9(b), two delivery eyes 15 for feeding carbon fibers impregnated with matrix precursors through them are disposed in line symmetric relation via the drive unit 20. When each of the delivery eyes 15 is moved along the outer periphery of each mandrel 11, the filament windings including the poral winding, the parallel winding and the level winding can be freely performed.

Further, examples will be described below.

(EXAMPLE 1)

The mandrel of FIG. 1 was used in this Example, and a layer of a plain weave cloth of TOREKA T-300 6K (available from TORAY INDUSTRIES, INC.) impregnated with phenol resin was laminated on the mandrel, before the application of the filament windings thereon. In the filament windings, with six filaments of TOREKA T-300 12K (available from TORAY INDUSTRIES, INC.) being impregnated with phenol resin, the level winding and the parallel winding of a contact angle of 85° to 90° with respect to the center axis were alternately wound three layers each. While the drum portion is allowed to have six layers of the alternate parallel and level windings, the bottom portion is allowed to have the layers of the level windings only. For this reason, after the application of the parallel windings, segments into which the 1D pre-preg was cut were laminated on a part of the bottom portion adjacent to the drum portion one by one in a ring-like form. Thus, the molded member having a thickness of layer of 7 mm was obtained.

Sequentially, the volatile matter of the obtained molded member was adjusted in an oven at 100° C. and, thereafter, with the molded member covered with a vacuum pack to draw a vacuum, the molded member was thermoset by increasing the temperature of the oven up to 200° C. After having been thermoset, the molded member was removed from the mandrel to obtain a crucible-like molded member.

Then, a deformation preventing jig made of graphite was attached to the molded member so that roundness of the drum portion could be kept and, thereafter, the molded member was increased in temperature up to 1,000° C. at the rate of rise of temperature of 10° C./hr. in an electric oven, with nitrogen injected in the electric oven, to obtain the C/C composite material.

Also, pitch impregnation and baking were repeated four times to densify the C/C composite material. Further, as a final heat-treatment, the molded member was heat-treated at 2,000° C. in a stream of nitrogen, with the deformation preventing graphite jig attached thereto. Thereafter, the bottom portion of the crucible was machined. Further, for the purpose of high purification, after having been set in a vacuum furnace and heated up to 2,000° C. the crucible was allowed to keep for 20 hours under the pressure inside the vacuum furnace of 10 torr in the vacuum furnace in which chlorine gas was supplied. Further, for the purpose of the C/C composite material being impregnated and coated with pyrolytic carbon, the crucible was set in the vacuum furnace and was allowed to keep for 100 hours under the pressure inside the vacuum furnace of 25 torr in the vacuum furnace in which methane gas was supplied, and then the densifying treatment of the C/C composite material was performed by using the pyrolytic carbon in the CVI process to thereby produce the end product. It was found that the CVI process increased the bulk density of the C/C composite material from 1.6 to 1.7 and decreased the porosity from 20% to 14.5%.

In operation, the crucible made of the C/C composite material thus obtained was applied to the single crystal pulling apparatus. It was confirmed that while cracks developed in the bottom portion of the quartz crucible thrown away every time it was used once, the crucible made of the C/C composite material had strength both at the drum portion and at the bottom portion. It was also found that in the inner surface of the crucible of the C/C composite material as well, the reaction of the C/C composite material with $SiO_2$ was inhibited by the pyrolytic carbon, and in 30 operations, some wear was merely found in a part of the bottom portion adjacent to the drum portion.

(EXAMPLE 2)

Except the use of the mandrel like that of FIG. 7 and the presence of the hole in the bottom portion of the crucible, this Example is all the same as Example 1.

The results of good handling properties of light weight and rigidity and of inhibition of reaction of the C/C composite material with SiO$_2$ were provided, as are the same as in Example 1. However, in the same 30 operations as in Example 1, indication of development of a crack was found around the hole in the bottom portion.

(COMPARATIVE EXAMPLE 1)

The molding in the crucible form was performed by using the mandrel shown in FIG. 7 and simply using the combination of the helical winding and the parallel winding. The result was that in the helical winding, carbon fiber yarns were moved out of position, so that they could not be wound so close to the rotation axis as in Example 2. As a result, the crucible having a larger bottom hole than that of the Example was produced. The parallel winding was alternated with the helical winding and was performed in the same manner as the Examples 1 and 2. Also, the CVI was also performed in the same manner and it was found that similar increase of density was provided.

However, in actual operations, because of large bottom hole of the molded crucible, the quartz crucible softened was deformed in the form of the plug plugged in the bottom hole being pushed out in every operation, so that, after operations, the molded crucible was found to be inclined itself in almost all operations. In the same 30 operations as in Examples 1 and 2, cracks were found to develop in the molded crucible, presumably because the molded crucible underwent a large stress caused by deformation of the quartz crucible in every operation.

Capabilities of Exploitation in Industry

The present invention is suitable for a crucible applied to an apparatus for pulling single crystals of silicon, gallium or their compound.

What is claimed is:

1. A single crystal pulling crucible comprising a cylindrical drum portion and a bottom portion and formed of carbon fiber reinforced carbon composite material, said single crystal pulling crucible comprising:
    a circumferentially reinforced layer formed by said carbon fibers being paralleled and being so wound along a circumferential direction of the crucible as to pass through said drum portion; and
    an axially reinforced layer formed by said carbon fibers being paralleled and being so wound along an axial direction of the crucible as to lay over said bottom portion and extend therefrom to said drum portion.

2. A single crystal pulling crucible according to claim 1, wherein said axially reinforced layer is arranged laying over a center of said bottom portion and said bottom portion is integrally formed, having no hole.

3. A single crystal pulling crucible according to claim 1, wherein said circumferentially reinforced layer is formed by at least either of a parallel winding of a contact angle of 70° to 90° with respect to a center axis of the crucible and a helical winding, and said axially reinforced layer is formed by at least either of a level winding of a contact angle of 0° to 10° with respect to said center axis and a poral winding.

4. A single crystal pulling crucible according to claim 3, wherein two or more sets of combination of said circumferentially reinforced layer and said axially reinforced layer are laminated.

5. A single crystal pulling crucible according to claim 1, wherein an innermost layer in said drum portion and bottom portion is formed by lamination of a carbon fiber cloth.

6. A single crystal pulling crucible according to claim 1, wherein a surface of said carbon fiber reinforced carbon composite material is impregnated and covered with pyrolytic carbon.

7. A single crystal pulling crucible comprising a cylindrical drum portion and a bottom portion and formed of carbon fiber reinforced carbon composite material, wherein said single crystal pulling crucible has a multi-layer construction comprising a circumferentially reinforced layer formed by said carbon fibers being paralleled and wound; and an axially reinforced layer formed by said carbon fibers being paralleled and laid over said bottom portion, and wherein said bottom portion is integrally formed without any hole.

8. A single crystal pulling crucible comprising a cylindrical drum portion and a bottom portion and formed of carbon fiber reinforced carbon composite material, wherein said single crystal pulling crucible has a multi-layer construction comprising a circumferentially reinforced layer formed by said carbon fibers being paralleled and wound; and an axially reinforced layer formed by said carbon fibers being paralleled and laid over said bottom portion, and wherein a surface of said carbon fiber reinforced carbon composite material is impregnated and covered with pyrolytic carbon.

9. A single crystal pulling crucible comprising a cylindrical drum portion and a bottom portion and formed of carbon fiber reinforced carbon composite material, said single crystal pulling crucible comprising:
    a first reinforced layer formed by said carbon fibers being paralleled and being so wound as to lay over said bottom portion and extend therefrom to said drum portion;
    a second reinforced layer formed by a plurality of sheets of said carbon fibers being laminated on a part of said bottom portion adjacent to said drum portion in a ring-like form; and
    a third reinforced layer formed by said carbon fibers being paralleled and wound along a circumferential direction of said drum portion.

10. A single crystal pulling crucible according to claim 9, wherein said first reinforced layer is arranged laying over a center of said bottom portion and said bottom portion is integrally formed without any hole.

11. A single crystal pulling crucible according to claim 9, wherein said first reinforced layer is formed by at least either of a level winding of a contact angle of 0° to 10° with respect to a center axis of the crucible and a poral winding; said second reinforced layer is formed by lamination of at least either of an 1D sheet and a 2D sheet; and said third reinforced layer is formed by at least either of a parallel winding of a contact angle of 70° to 90° with respect to said center axis and a helical winding.

12. A single crystal pulling crucible according to claim 11, wherein two or more sets of combination of said first, second and third reinforced layers are laminated.

13. A single crystal pulling crucible according to claim 9, wherein an innermost layer in said drum portion and bottom portion is formed by lamination of a carbon fiber cloth.

14. A single crystal pulling crucible according to claim 9, wherein a surface of said carbon fiber reinforced carbon composite material is impregnated and covered with pyrolytic carbon.

15. A single crystal pulling crucible comprising a cylindrical drum portion and a bottom portion and formed of carbon fiber reinforced carbon composite material, wherein said single crystal pulling crucible has a multi-layer construction comprising a first reinforced layer formed by said carbon fibers being paralleled and laid over said bottom portion; a second reinforced layer formed by carbon fiber sheets being laminated on a part of said bottom portion adjacent to said drum portion in a ring-like form; and a third reinforced layer formed by said carbon fibers being paralleled and wound along a circumferential direction of said drum portion and wherein said bottom portion is integrally formed without any hole.

16. A single crystal pulling crucible comprising a cylindrical drum portion and a bottom portion and formed of carbon fiber reinforced carbon composite material, wherein said single crystal pulling crucible has a multi-layer construction comprising a first reinforced layer formed by said carbon fibers being paralleled and laid over said bottom portion; a second reinforced layer formed by carbon fiber sheets being laminated on a part of said bottom portion adjacent to said drum portion in a ring-like form; and a third reinforced layer formed by said carbon fibers being paralleled and wound along a circumferential direction of said drum portion and wherein a surface of said carbon fiber reinforced carbon composite material is impregnated and covered with pyrolytic carbon.

17. A method of producing a single crystal pulling crucible comprising a cylindrical drum portion and a bottom portion and formed of carbon fiber reinforced carbon composite material, said method comprising the steps of:

using a mandrel having a cylindrical portion having an outer diameter substantially equal to an inner diameter of said drum portion and a length larger than said drum portion; a protruding portion, located at one end of said cylindrical portion, for said bottom portion to fit therein; and a shaft projecting from the other end of said cylindrical portion at a center thereof, to produce a first molded member by the windings including a level winding of carbon fibers impregnated with matrix precursor being obliquely wound from the protruding portion to the other end of said cylindrical portion and a parallel winding of said carbon fibers impregnated with matrix precursor being wound in a circumferential direction of said cylindrical portion; and cutting said cylindrical portion of said first molded member at the other end side to produce a second cruciblelike molded member.

18. A single crystal pulling crucible comprising a cylindrical drum portion and a bottom portion and formed of carbon fiber reinforced carbon composite material, wherein carbon fibers of said carbon fiber reinforced carbon composite material are arranged including the winding by combination of a level winding of said carbon fibers being obliquely extended from said bottom portion to said drum portion and wound with varied distances from an apex of said bottom portion so that they can pass through the entire bottom portion without being converged on said apex and a parallel winding of said carbon fibers being wound in a circumferential direction of said drum portion and wherein said bottom portion is formed without any hole.

19. A method of producing a single crystal pulling crucible comprising a cylindrical drum portion and a bottom portion and formed of carbon fiber reinforced carbon composite material, said method comprising the steps of:

using a mandrel having a cylindrical portion having an outer diameter substantially equal to an inner diameter of said drum portion and a length larger than twice as long as the drum portion; protruding portions, located at both ends of said cylindrical portion, for said bottom portion to fit therein; and a shaft projecting from a center of at least one of said protruding portions, to produce a first molded member by the windings including a level winding of carbon fibers impregnated with matrix precursor being wound so obliquely as to be engaged with said protruding portions at said both ends and a parallel winding of said carbon fibers impregnated with matrix precursor being wound in a circumferential direction of said cylindrical portion; and cutting said first molded member at a center of said cylindrical portion to produce two number of second molded members having in said bottom portion a hole for allowing said shaft to pass through it.

20. A single crystal pulling crucible comprising a cylindrical drum portion and a bottom portion and formed of carbon fiber reinforced carbon composite material, wherein carbon fibers of said carbon fiber reinforced carbon composite material are arranged including the winding by combination of a level winding of said carbon fibers being obliquely extended from said bottom portion to said drum portion, skirting along a hole in said bottom portion and a parallel winding of said carbon fibers being wound in a circumferential direction of said drum portion and wherein said bottom portion is formed, having a hole.

* * * * *